United States Patent [19]

Sethuraman et al.

[11] Patent Number: 6,001,269

[45] Date of Patent: Dec. 14, 1999

[54] METHOD FOR POLISHING A COMPOSITE COMPRISING AN INSULATOR, A METAL, AND TITANIUM

[75] Inventors: Anantha R. Sethuraman, Avondale; Lee Melbourne Cook, Steelville, both of Pa.; Huey-Ming Wang, Hockessin; Guangwei Wu, Wilmington, both of Del.

[73] Assignee: Rodel, Inc., Newark, Del.

[21] Appl. No.: 08/859,132

[22] Filed: May 20, 1997

[51] Int. Cl.[6] .................................................. B24B 1/00
[52] U.S. Cl. ............................ 216/89; 438/692; 438/693
[58] Field of Search ................................... 438/693, 692; 216/89; 451/41

[56] References Cited

U.S. PATENT DOCUMENTS

| | | | |
|---|---|---|---|
| 5,391,258 | 2/1995 | Brancaleoni et al. | 156/636 |
| 5,476,606 | 12/1995 | Branacaleoni et al. | 252/79.1 |
| 5,527,423 | 6/1996 | Neville et al. | 438/693 |

FOREIGN PATENT DOCUMENTS

WO 95/24054   9/1995   WIPO.

OTHER PUBLICATIONS

Rutten et al., "Pattern Density Effects in Tungsten CMP", Jun. 27–29, 1995 VMIC Conf., ISMIC–104/95/0491, 1995.

*Primary Examiner*—Bruce Breneman
*Assistant Examiner*—Shamim Ahmed
*Attorney, Agent, or Firm*—Kenneth A. Benson; Konrad H. Kaeding

[57] ABSTRACT

A process is provided for polishing a composite comprised of an insulating layer, a metal and titanium in which the composite is polished in a standard polishing machine using an aqueous slurry comprising submicron abrasive particles, an iodate, and a peroxide. Another process is provided in which peroxide is added to the aqueous slurry only when a titanium or titanium nitride layer is being polished. Further the invention also comprises the addition of a base to the slurry stream exiting the polishing machine to bring the pH of the used slurry to about 7 or higher.

10 Claims, 4 Drawing Sheets

METHOD FOR POLISHING A COMPOSITE COMPRISING AN INSULATOR, A METAL, AND TITANIUM

BACKGROUND OF THE INVENTION

1. Field of the Invention

The present invention relates to processes for the chemical-mechanical polishing of substrates, especially those comprising an insulator, a metal and titanium. More especially it relates to the polishing of substrates comprising silicon dioxide, tungsten, and titanium.

2. Description of Related Art

The chemical-mechanical polishing (CMP) of metals is common in the manufacture of semiconductor wafers. Vias are etched in silicon wafers and the wafer surface is then coated with the metal to fill the vias. This surface is then planarized by CMP to provide a perfectly flat surface for further processing of the wafer. Often the metal of choice for the circuit structure thus formed is tungsten. As shown in FIG. 1, often titanium 22 is coated onto the insulating base of silicon oxide 21 to provide a barrier to diffusion of tungsten 24 into the insulating layer and then a layer titanium nitride 23 is used to promote adhesion of tungsten 24 to the structure. Ideally, this structure is planarized to expose the insulating base before proceeding with subsequent steps in the manufacture of the integrated circuit. Rutten et al. ("Pattern Density Effects in Tungsten CMP", Jun. 27–29, 1995 VMIC Conference, ISMIC—104/95/0491) discusses the problems encountered when planarizing a structure in which tungsten, titanium and titanium nitride are used. Ideally, the titanium and titanium nitride layers should be removed at a rate comparable to the rate for tungsten removal.

In order to efficiently remove a metal layer, the surface of the metal is oxidized and the oxide is then removed by CMP. An iodate, such as potassium iodate has become a common oxidant for use in tungsten planarization. It has replaced the earlier use of hydrogen peroxide, $H_2O_2$, as the oxidant because although $H_2O_2$ provides a high removal rate for both tungsten and titanium, the removal from the center portion of tungsten in a via may be so great that dishing occurs as shown in FIG. 1b. Also, a void created in the metal layer during deposition may be exposed as shown in FIG. 1c creating a "keyhole" in the metal structure. This is particularly undesirable.

Also, in the planarization of the metal and titanium layers the rate of removal of the insulating layer, silicon dioxide, should be as low as possible. Often compounds which suppress the rate of removal of silica are included in the polishing slurries. Such compounds are described by Brancaleoni et al. in U.S. Pat. No. 5,391,258 and U.S. Pat. No. 5,476,606.

SUMMARY OF THE INVENTION

A process for polishing a composite comprised of an insulating layer, a metal and titanium comprising polishing the composite in a standard polishing machine using an aqueous slurry comprising submicron abrasive particles, an iodate and a peroxide.

A process for polishing a composite comprised of an insulating layer, a metal and titanium comprising (a) polishing the composite in a standard polishing machine using an aqueous slurry comprising submicron abrasive particles and an iodate as the oxidant for the metal layer, (b) when polishing a layer containing titanium, adding to the slurry provided to the polishing machine hydrogen peroxide in an amount required to produce an entering slurry with about 0.5% to about 10% hydrogen peroxide by weight.

Another aspect of the invention is the processes above also comprising the addition of a base to the slurry stream exiting the polishing machine to bring the pH of the used slurry to about 7 or higher while the polishing processes are carried out.

A further aspect of the invention is the process above wherein the slurry further comprises a compound or compounds which suppress the rate of removal of silica.

The metals in the composite with titanium may be tungsten, copper or aluminum.

DESCRIPTION OF THE PREFERRED EMBODIMENTS

Figure 1A:
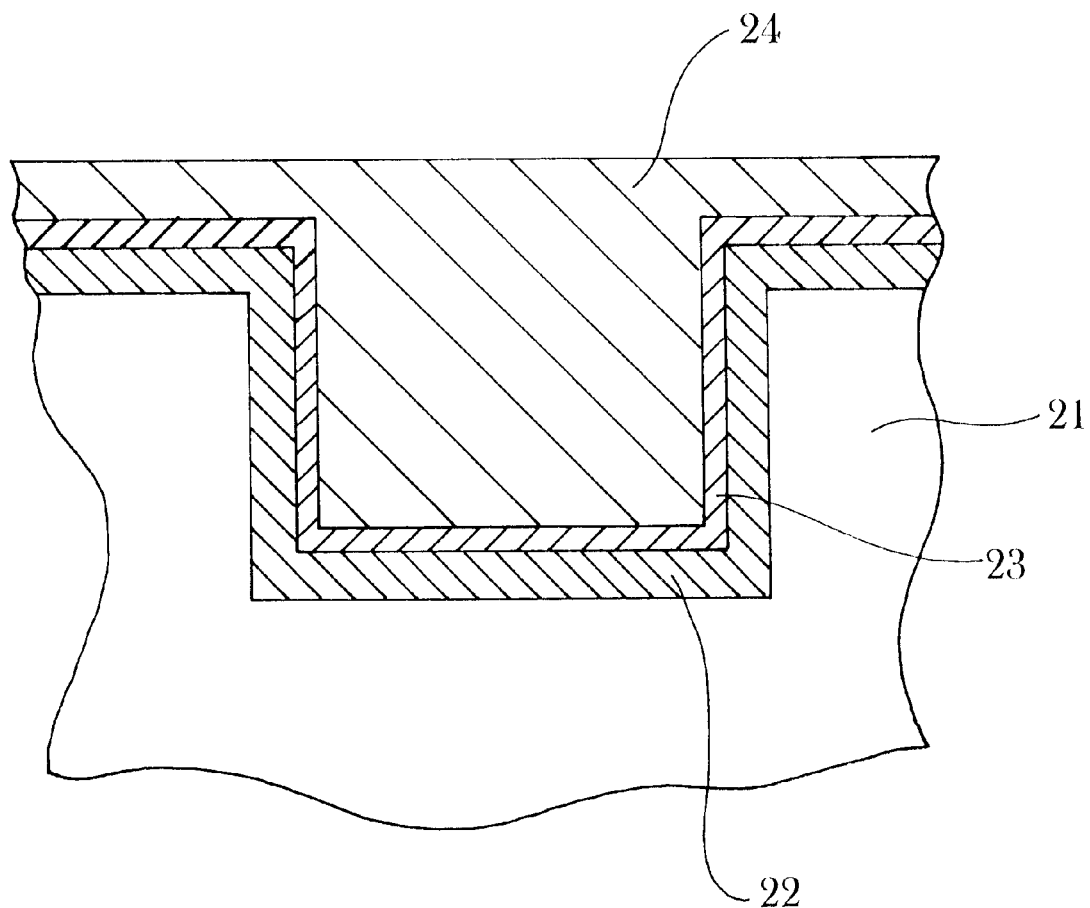
FIG. 1a is a cross-section of a via etched into an insulating layer (silicon oxide) which is filled with a barrier layer (titanium), an adhesion layer (titanium nitride), and a metal (tungsten).
Figure 1B:
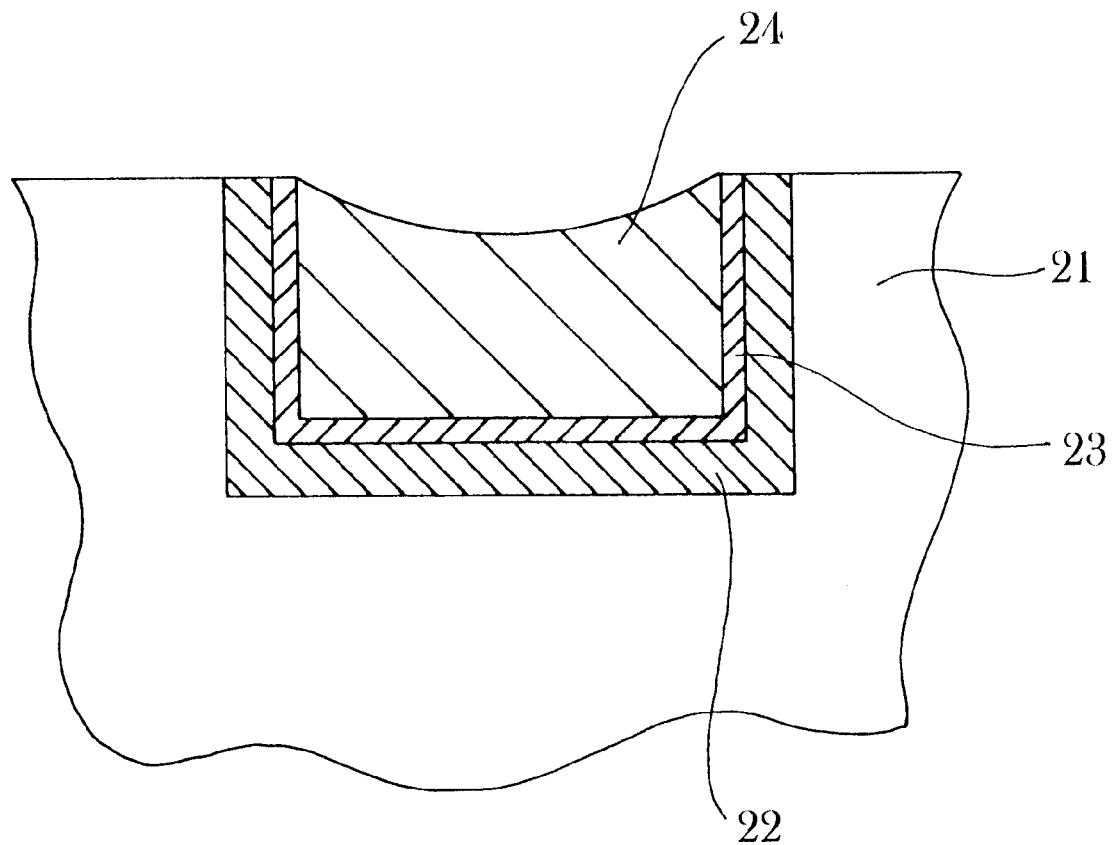
FIG. 1b is the structure shown in FIG. 1a after polishing wherein dishing has occurred in the metal.
Figure 1C:
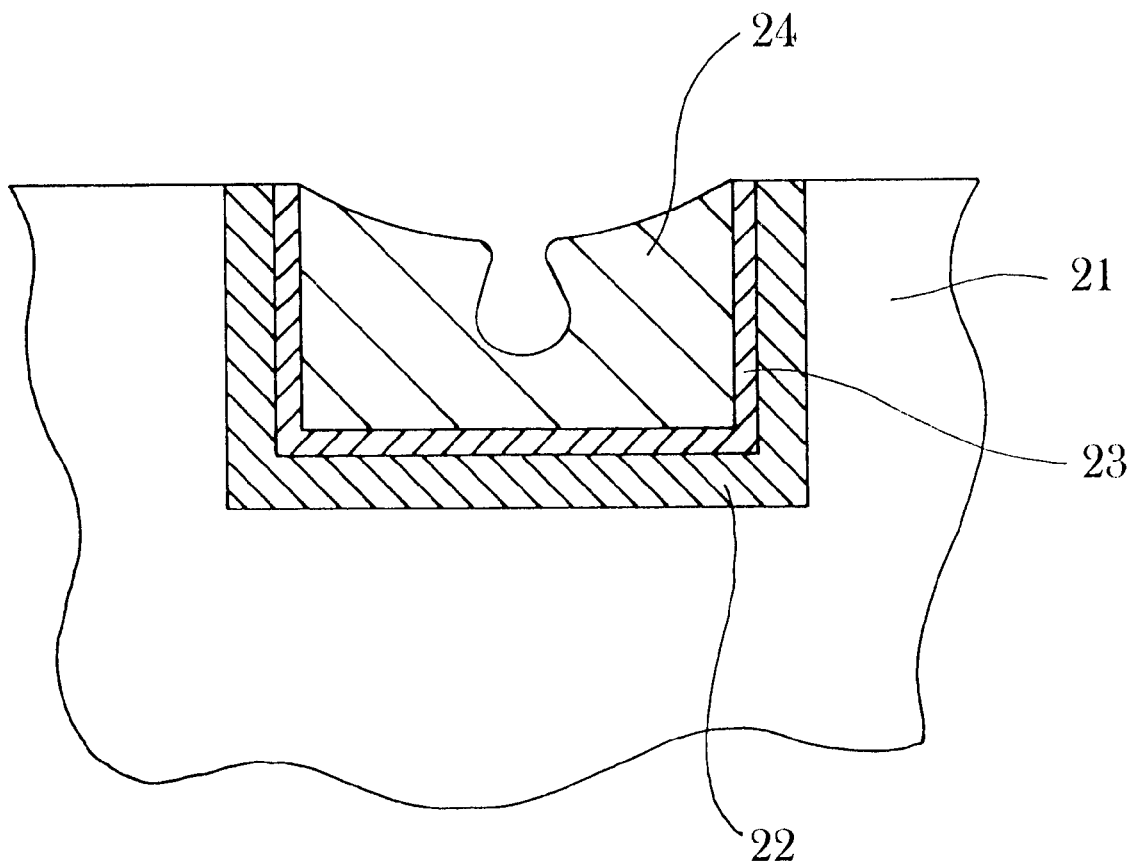
FIG. 1c is the structure of a metal filled via in which a "keyhole" has been formed.
Figure 2:
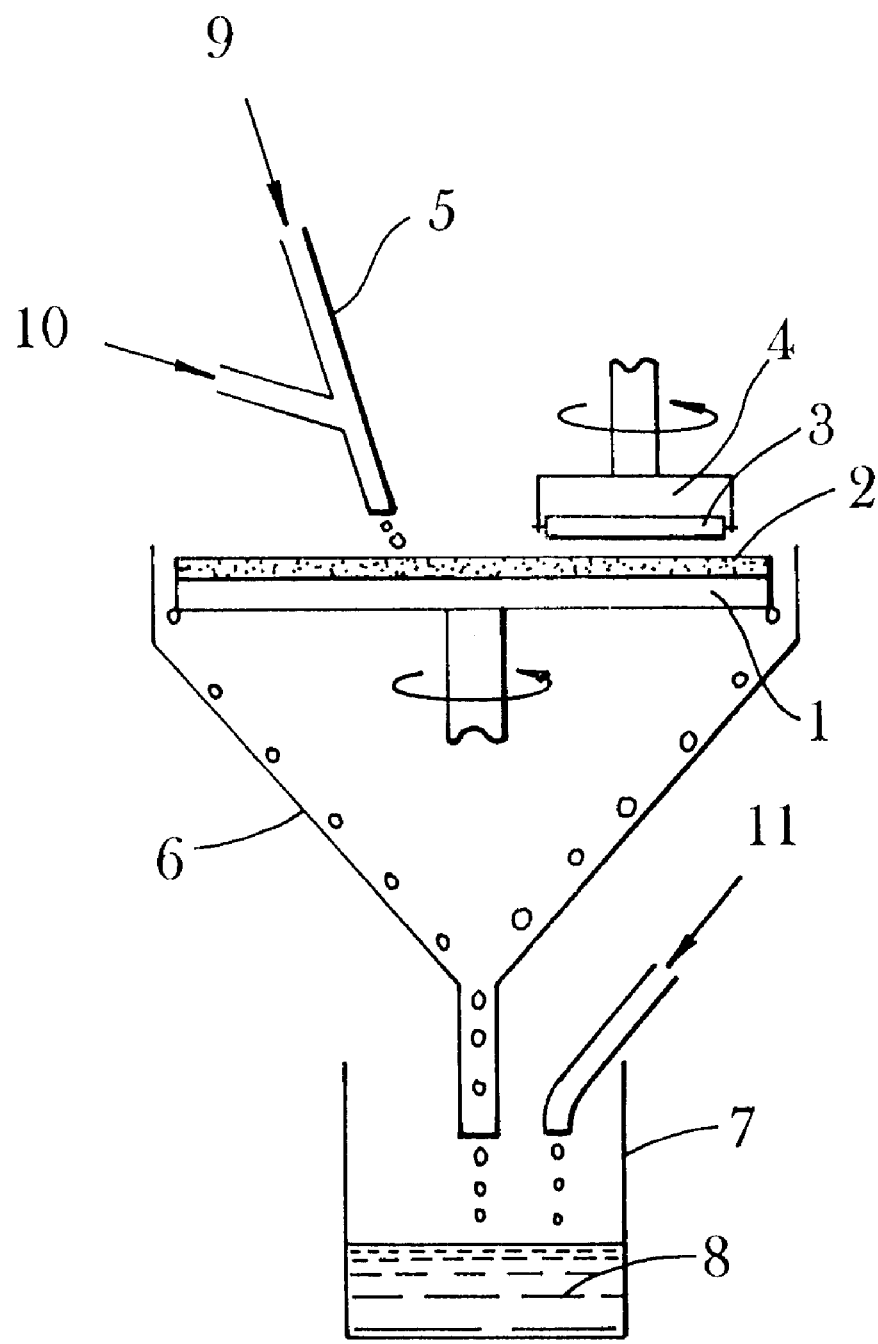
FIG. 2 is a schematic drawing showing the process of this invention.

In order to provide the advantages of using potassium iodate ($KIO_3$) as the oxidizer when polishing a metal such as tungsten and the advantages of using hydrogen peroxide ($H_2O_2$) as the oxidizer when polishing titanium and titanium nitride, a process has been developed to use both of these oxidizers. The following general process shown on FIG. 2 will provide a safe, very efficient method for polishing a composite with an insulating layer, such as silicon dioxide, plus a metal, titanium, and titanium nitride layers: The composite structure, in the form of an integrated circuit semiconductor wafer 3, is placed in a standard wafer polishing machine as shown in the schematic diagram of FIG. 2 to have a platen 1 to which a polishing pad 2 is attached. The wafer 3 in a wafer carrier 4 is pressed against the surface of the polishing pad 2 while there is relative motion between the pad and the wafer. An abrasive slurry is provided to the surface of the polishing pad via a means 5. The slurry provided to the polishing process is shown in this example to flow across the circular rotating pad and exit from the edge of the pad into a catch basin 6. The catch basin directs the used slurry to a waste holding tank 8. As shown in FIG. 1a, the layers to be removed in the process of this invention are first tungsten 24 then titanium nitride 23 and then titanium 22. It is most advantageous to use $KIO_3$ as the oxidant in the slurry during the first step. When titanium starts to show up in the slurry exiting from the polishing machine, one starts adding an aqueous solution of $H_2O_2$ 10 to the incoming slurry 9 just before it discharges onto the polishing pad. This will provide faster polishing of the titanium or titanium nitride layer which does not easily oxidize and therefore is not easily removed by a chemical-mechanical polishing process. It is desirable to make this part of the polishing process as short as possible so that dishing and "keyholing" is not caused in the tungsten which is exposed to this part of the polishing process. When the insulating base (silicon oxide) is exposed the process is complete.

It is also possible to add hydrogen peroxide to the slurries used in this invention during the entire polishing process. For example, a slurry with a constant composition comprising both an iodate and a peroxide can be used throughout the polishing process thereby making it unnecessary to change the composition during the process. In such a case it may be advantageous to neutralize the effluent from the polishing machine so that the iodate is not easily oxidized in the waste stream.

There are several methods for determining when to add hydrogen peroxide to the slurry entering the polishing process if one is adding it only during the polishing of titanium and/or titanium nitride. One can estimate the time it will take to remove the metal layer based on previous experience. Also a detection device looking at the surface of the wafer could be used to detect the presence of titanium or titanium ions. A third possibility would be to use an indicator on the exiting slurry to detect the presence of titanium ions. The last method may easily detect both the onset and the end of polishing the layers containing titanium.

EXAMPLE

To show the efficacy of using the processes as described above, 6 inch wafers were polished on a Strausbaugh 6DS-SP polishing machine under the following conditions: pressure 8 psi, carrier 50 rpm, platen 40 rpm, back pressure 3 psi using an IC1400-K/Suba™ IV pad (available from Rodel, Inc., Newark, Del.). A first polishing slurry 9 had the following composition (by weight): about 3% potassium iodate, about 2.5% ammonium hydrogen phthalate, about 5.0% submicron alumina and the remaining being deionized water. The 6 inch wafers were coated with tungsten, titanium, or silicon oxide. Removal rate for each coating was determined by measuring the change in thickness of the coating over a given time period. Table 1 shows the results of polishing with the polishing slurry 9 described above and with the addition of 30% hydrogen peroxide to give a slurry as used comprising about 1.5% and about 3% hydrogen peroxide.

TABLE 1

| Slurry | H2O2 (wt. %) | Removal Rate (Angstroms/min) | | | Selectivity | |
|---|---|---|---|---|---|---|
| | | W | Ti | Oxide | W/Ti | W/Ox |
| #9 | 0 | 1800 | 610 | 65 | 3.0 | 28 |
| #9 + 1.5 | 1.5 | 2400 | 1500 | 100 | 1.6 | 24 |
| #9 + 3 | 3 | 2650 | >2360 | 130 | <1.1 | 20 |

One can see by these data that the removal rate of Ti can be brought up to the rate at which W is removed when using slurry #9 by simply adding hydrogen peroxide to slurry #9. Under these conditions the rate of tungsten removal will be increased somewhat, but overall the rates of tungsten and titanium removal will be near 1 to 1.

These data show that the amount of hydrogen peroxide added to the incoming slurry is in the amount to give a slurry comprising about 0.5% to 10% by weight hydrogen peroxide. More preferably, the incoming slurry comprises about 1% to 5% by weight hydrogen peroxide.

Also, the rate of silicon oxide removal is maintained low so that the selectivity of tungsten to silicon oxide removal rates remains above 20. Optionally the slurries used in this invention may contain compounds which suppress the rate of removal of silica. Compounds which act as complexing agents or chelating agents for $SiO_2$ and, therefore, suppress the rate of removal of silica are described in great detail in U.S. Pat. No. 5,391,258 and U.S. Pat. No. 5,476,606. These compounds must have at least two acid groups present in the structure which can affect complexation to the silica. Acid species are defined as those functional groups having a dissociable proton. These include, but are not limited to, carboxylate, hydroxyl, sulfonic and phosphonic groups. Carboxylate and hydroxyl groups are preferred as these are present in the widest variety of effective species. Particularly effective are structures which possess two or more carboxylate groups with hydroxyl groups in an alpha position, such as straight chain mono- and di-carboxylic acids and salts including, for example, malic acid and malates, tartaric acid and tartarates and gluconic acid and gluconates. Also effective are tri- and polycarboxylic acids and salts with secondary or tertiary hydroxyl groups in an alpha position relative to a carboxylic group such as citric acid and citrates. Also effective are compounds containing a benzene ring such as ortho di- and polyhydroxybenzoic acids and acid salts, phthalic acid and acid salts, pyrocatecol, pyrogallol, gallic acid and gallates and tannic acid and tannates. Generally these complexing agents are used in slurries for CMP at about 2% to about 7% by weight. Examples of such compounds are potassium hydrogen phthalate and ammonium hydrogen phthalate.

It is known that iodate will react with hydrogen peroxide and that the following reaction occurs:

$$2IO_3^- + 2H^+ + 5H_2O_2 \rightleftharpoons I_2 + 6H_2O + 5O_2$$

It has been shown that this reaction proceeds rapidly in an acid environment but proceeds very slowly in a basic or neutral environment. It has also been observed that organic acids, such as the compounds which suppress the rate of removal of silica, accelerate this reaction. Therefore, in order to suppress this reaction in the waste stream of slurry from the polishing process, it may be desirable to add as shown on FIG. 2 a base 11 to the waste slurry 8 to maintain it in a neutral or basic condition wherein there is little or no reduction of the iodate to iodine.

Any base such as a hydroxide may be used to neutralize the waste slurry stream from the polishing process of this invention. A hydroxide such as potassium or sodium hydroxide might be used.

We claim:

1. A process for polishing a composite comprised of an insulating layer, a metal, and titanium comprising polishing said composite in a standard polishing machine using an aqueous slurry comprising submicron abrasive particles, an iodate, and a peroxide wherein said process further comprises the addition of a base to the slurry stream exiting said polishing machine to bring the pH of the used slurry to about 7 or higher.

2. A process for polishing a composite comprising an insulating layer, a metal, and titanium comprising:
   (a) polishing said composite in a standard polishing machine using an aqueous slurry comprising submicron abrasive particles and potassium iodate as the oxidant for the metal layer,
   (b) when polishing a layer containing titanium, adding to the slurry provided to the polishing machine hydrogen peroxide in an amount required to produce an entering slurry with about 0.5% to about 10% hydrogen peroxide by weight, and
   (c) when providing hydrogen peroxide to the slurry provided to said polishing machine, adding a base to the slurry stream exiting said polishing machine to bring the pH of the used slurry to about 7 or higher.

3. The process of claim 1 wherein said slurry further comprises a compound or compounds which suppress the rate of removal of silica.

4. The process of claim 2 wherein said slurry further comprises a compound or compounds which suppress the rate of removal of silica.

5. The process of claim 1 wherein said metal layer is tungsten.

6. The process of claim 2 wherein said metal layer is tungsten.

7. The process of claim 1 wherein said metal layer is aluminum.

8. The process of claim 2 wherein said metal layer is aluminum.

9. The process of claim 1 wherein said metal layer is copper.

10. The process of claim 2 wherein said metal layer is copper.

* * * * *